United States Patent
Gambart

(10) Patent No.: US 10,466,097 B2
(45) Date of Patent: Nov. 5, 2019

(54) 3D IMAGING OPTOELECTRONIC MODULE

(71) Applicant: 3D Plus, Buc (FR)

(72) Inventor: Didier Gambart, Viroflay (FR)

(73) Assignee: 3D PLUS, Buc (FR)

( * ) Notice: Subject to any disclaimer, the term of this patent is extended or adjusted under 35 U.S.C. 154(b) by 131 days.

(21) Appl. No.: 15/843,883

(22) Filed: Dec. 15, 2017

(65) Prior Publication Data

US 2018/0172504 A1    Jun. 21, 2018

(30) Foreign Application Priority Data

Dec. 20, 2016 (FR) .................................. 16 62823

(51) Int. Cl.
*G01J 1/02* (2006.01)
*G01J 1/42* (2006.01)
*H01L 27/146* (2006.01)
*H04N 5/225* (2006.01)

(52) U.S. Cl.
CPC .......... *G01J 1/0219* (2013.01); *G01J 1/0204* (2013.01); *G01J 1/0252* (2013.01); *G01J 1/0271* (2013.01); *G01J 1/42* (2013.01); *H01L 27/14618* (2013.01); *H01L 27/14683* (2013.01); *H04N 5/2257* (2013.01)

(58) Field of Classification Search
CPC ...... G01J 1/0219; G01J 1/0204; G01J 1/0271; G01J 1/0252; G01J 1/42; H04N 5/2257; H01L 27/14683; H01L 27/14618

USPC ......................................................... 250/239
See application file for complete search history.

(56) References Cited

U.S. PATENT DOCUMENTS

| 6,470,103 B2 * | 10/2002 | Watanabe | G02B 6/4224 385/14 |
| 9,768,361 B2 * | 9/2017 | Riel | G02B 7/02 |
| 2008/0192435 A1 | 8/2008 | Yamamiya | |
| 2014/0240588 A1 | 8/2014 | Sakuragi et al. | |

FOREIGN PATENT DOCUMENTS

JP    2001-188155 A    7/2001

* cited by examiner

*Primary Examiner* — Seung C Sohn
(74) *Attorney, Agent, or Firm* — Baker & Hostetler LLP

(57) ABSTRACT

A 3D imaging optoelectronic module intended to be fixed to an image-forming device comprises: an optoelectronic sensor comprising a package with a chip electrically connected to a stack of at least one printed circuit board, the sensor and stack assembly molded in a resin and having faces according to Z with electrical interconnection tracks of the printed circuit boards. It comprises a thermally conductive rigid cradle in the form of a frame having a reference surface according to X, Y and: on a top surface: reference points intended to center and align the image-forming device in relation to the reference surface, fixing points to allow the fixing of the image-forming device, and an inner bearing surface having bearing points of the sensor adjusted to center and align the chip in relation to the reference surface.

7 Claims, 5 Drawing Sheets

3D IMAGING OPTOELECTRONIC MODULE

CROSS-REFERENCE TO RELATED APPLICATIONS

This application claims priority to foreign French patent application No. FR 1662823, filed on Dec. 20, 2016, the disclosure of which is incorporated by reference in its entirety.

FIELD OF THE INVENTION

The field of the invention is that of the 3D imaging, and more particularly space imaging, optoelectronic modules used for taking photographs or videos in all the wavelengths, for example for planetology, planet exploration, star view or satellite or launch vehicle monitoring missions.

BACKGROUND

It is known that in the space industry, it is desirable to miniaturize the 3D imaging optoelectronic modules while using larger optoelectronic sensors having a greater resolution, and while reducing the cost of the device.

FIG. 1 presents a conventional design of an optoelectronic device used in space imaging. It comprises, arranged according to an optical axis 103:

an image-forming optical device 100 with lenses 101 and a camera objective 102 and a photosensitive sensor 200.

FIG. 2 shows in more detail a photosensitive optoelectronic sensor 200. It comprises an active part 201 such as a silicon chip bonded in a package 203, for example of ceramic, which is the material generally used for space applications. The reference plane of the sensor is in most cases the rear face of the package 203. Electrical connections 204 in the form of PGA (Pin Grid Array) pins make it possible to ensure the connection between the chip and the outside of the package such as a PCB (Printed Circuit Board) circuit. The package is covered with a glass 202 glued onto the package 203.

The camera objective 102 must be perfectly aligned with the chip 201; it must be at right angles to the active surface of the chip and centred on this active surface. The centring accuracies demanded are of the order of 35 µm. This centring step is done manually and is followed by optical measurement phases. This step is lengthy and difficult and requires specific tools and qualified personnel. It is difficult to very accurately centre the camera objective on the chip because it is itself not very well centred in its package. FIGS. 3a and 3b give an idea of the positioning inaccuracies that appear in the step of gluing the chip in its package. The chip 201 can be offset in the plane XY as illustrated in FIG. 3b and/or exhibit an error of perpendicularity in relation to the optical axis 103 for example because of a variable thickness of glue 205 as illustrated in FIG. 3a. Errors of 150 µm and 80 µm, or even more, are commonly observed. Once the sensor 200 is fabricated, the chip 201 is no longer accessible and its positioning can no longer be rectified. The result thereof is that the positioning accuracy of the photosensitive chip does not comply with the desired final accuracy.

One of the problems for space use is also keeping the sensor at a low temperature. The performance levels of an optical sensor become degraded very quickly when the temperature increases. It is mainly the dark current which increases and in actual fact the black becomes grey which is a nuisance in space applications for which black is predominant in most of the images. This problem is amplified by the use of sensors having increasingly greater resolution and therefore dissipating more power.

The solutions currently used to cool the sensors are the addition of a Pelletier heat exchanger and a radiator for dissipating and for transmitting the calories. Over and above the high cost of this exchanger+radiator, the implementation thereof is difficult because the exchange surface of the chip is its bottom face by which it is glued. In addition, given the bulk of this assembly, the printed circuit board to which the sensor is connected is remotely sited, which has drawbacks. In effect, the separation between the sensor and the electronic components of the printed circuit board induces electronic noises.

SUMMARY OF THE INVENTION

The aim of the invention is to mitigate these drawbacks. Consequently, there currently remains a need for a 3D imaging optoelectronic module that simultaneously satisfies all the abovementioned requirements, in terms of dimensions, of cost, of centring and alignment accuracy and of operating temperature.

More specifically, the subject of the invention is a 3D imaging optoelectronic module intended to be fixed to an image-forming device, and which comprises:

an optoelectronic sensor comprising a package in which is housed a photosensitive chip with planar active face, with, on the opposite face, electrical connection pins connected to a stack of at least one printed circuit board equipped with electronic components, the sensor and stack assembly being moulded in a resin and having vertical faces according to Z metallized and etched to form electrical interconnection tracks of the printed circuit boards.

It is mainly characterized in that it comprises a thermally conductive rigid cradle in the form of a frame delimiting an aperture at its centre through which said pins pass, the frame having a reference surface according to X, Y and:

on a top surface:

fixing reference points intended to centre and align the image-forming device in relation to the reference surface, fixing points intended to allow the fixing of the image-forming device, and an inner bearing surface having bearing points of the sensor adjusted for the active face of the chip to be centred and aligned in relation to the reference surface.

The addition of this cradle simultaneously ensures the mechanical securing, the optical alignment, the electrical connection and the thermal dissipation. By virtue of this single piece, the cradle, the multiple constraints of use of an optical sensor, in the space domain in particular, are observed. The cradle is a piece that is easy to fabricate, inexpensive and easy to implement. As will be seen hereinbelow, a single operation is sufficient for the positioning and gluing of the sensor.

The reference surface is for example the top surface.

The inner bearing surface is preferably collinear to the top surface.

The optoelectronic sensor is typically that of a camera.

Another subject of the invention is a method for fabricating a 3D imaging optoelectronic module as described, characterized in that it comprises the following steps:

positioning the optoelectronic sensor on the inner bearing surface so as to align and centre the active face of the chip in relation to the reference surface by means of the centring points of the chip, fixing the positioned sensor, by gluing, assembling the sensor+frame assembly with the stack of printed circuit boards, moulding the stack and the frame in resin without exceeding the top surface of the frame, cutting along cutting axes according to Z to obtain side faces, metallizing and etching the side faces to electrically interconnect the printed circuit boards.

BRIEF DESCRIPTION OF THE DRAWINGS

Other features and advantages of the invention will become apparent on reading the following detailed description, given as a nonlimiting example and with reference to the attached drawings in which.

DETAILED DESCRIPTION

From one figure to another, the same elements are identified by the same references.

Hereinafter in the description, the expressions "front", "rear", "top", "bottom" are used with reference to the orientation of the figures described. In as much as the elements can be positioned according to other orientations, the directional terminology is indicated by way of illustration and is nonlimiting.

Figure 4:
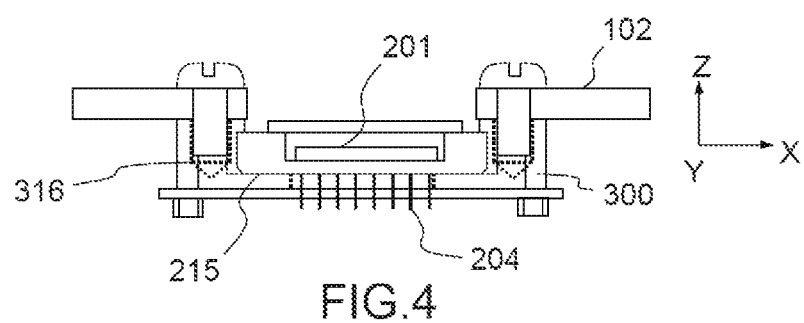
Figure 5:
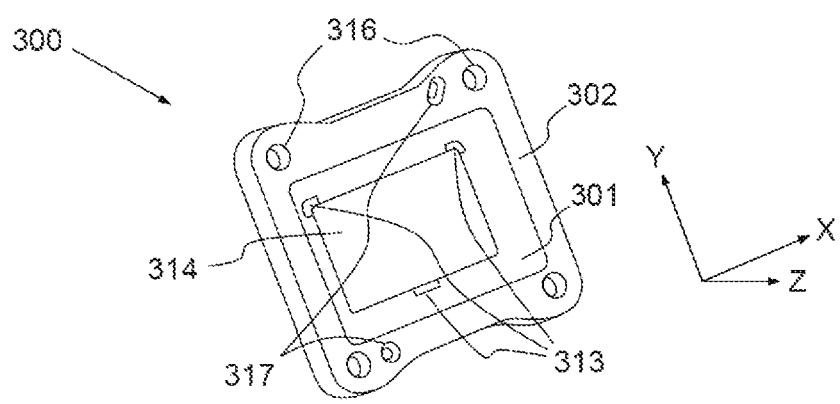

An example of elements included in a 3D imaging optoelectronic module according to the invention is described in relation to FIGS. 4 and 5. It comprises a cradle in the form of a rigid frame 300 in which the sensor 200 is positioned and glued by its rear face 215. The aperture 314 of the frame is provided to allow the passage of the electrical connections 204. It is generally rectangular but not necessarily.

This frame 300 is machined from a block with two planes which are:

the mounting plane 301 for gluing the sensor and
the plane of the top face 302.

One of these two planes is a reference plane. Hereinafter in the description, it is considered that it is the plane of the top face 302.

The frame 300 comprises:

in the mounting plane 301, bearing points 313 for the sensor (preferably three bearing points) used to align the chip 201 in relation to the reference plane of the frame, in the three axes on its top face 302, reference points 317 for fixing the camera objective 102 intended to centre and align the optical axis of the camera objective in relation to the reference plane of the frame. In our example, two reference points are used, one oblong and the other round; it is of course possible to use one or more other reference points, on its top face 302, tappings 316 or other equivalent means intended to cooperate with means for fixing the camera objective 102 on the frame.

The outline of the frame is parallelepipedal, possibly dished on the outside as in the example of FIG. 5 with two dished sides. The internal outline of the frame has a form corresponding to that of the sensor.

Figure 1:
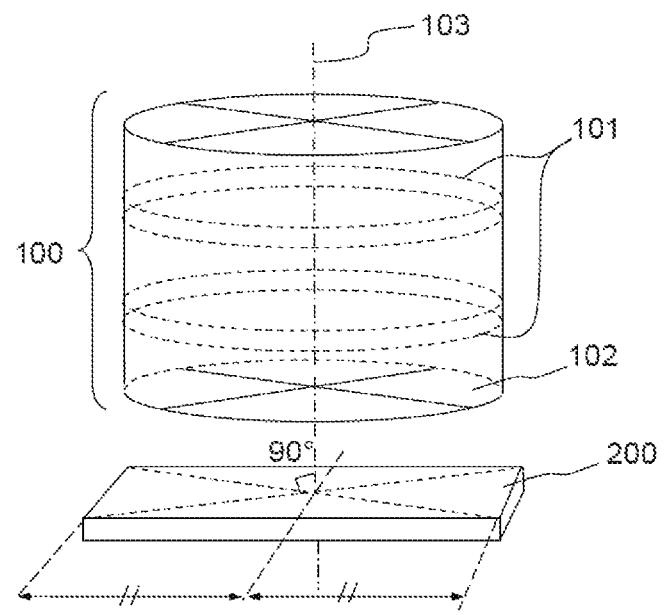
FIG. 1, already described, schematically represents an imaging optoelectronic device according to the prior art, FIG. 2, already described, schematically represents an example of optoelectronic sensor according to the prior art, seen in cross section.
Figure 2:
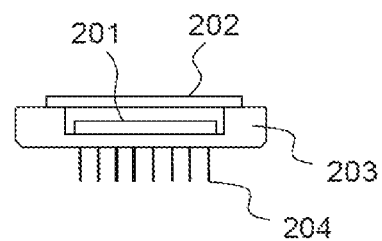
Figures 3A, 3B:
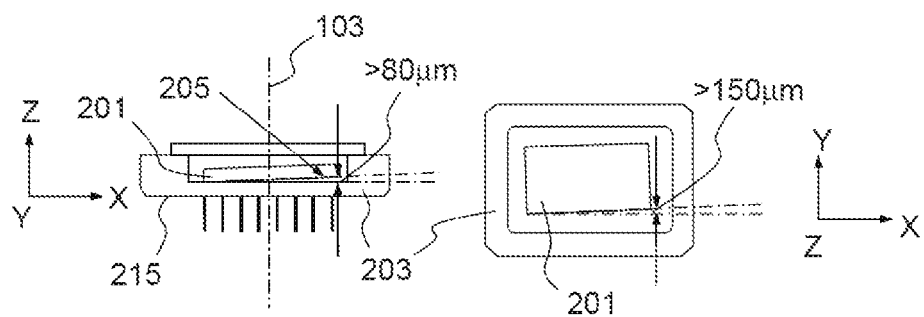
FIGS. 3a and 3b illustrate errors of positioning of the chip in its plane (seen from above FIG. 3b) and in relation to the optical axis (seen in cross section FIG. 3a), FIG. 4 schematically represents an example of elements used in a 3D imaging optoelectronic module according to the invention, seen in cross section, FIG. 5 schematically represents an example of frame used in a 3D imaging optoelectronic module according to the invention, in perspective, FIG. 6 schematically represents an example of a frame with a thermal interface ready to receive a sensor, FIGS. 7a and 7b schematically illustrate steps of fabrication of a 3D imaging optoelectronic module according to the invention, FIG. 7a illustrating the step of moulding the sensor+cradle+stack assembly in resin, FIG. 7b illustrating the step of cutting the moulded assembly, FIG. 8 schematically represents an example of 3D imaging optoelectronic module according to the invention seen in perspective.

The step of gluing the sensor 200 in the frame 300 is performed by a positioning machine of "pick and place" type for example. The machine deposits a glue on the gluing surface 301 of the frame (=bearing surface of the sensor), then positions the sensor 200 in the frame on this surface, then performs the optical alignment of the chip 201 in relation to the frame (that is to say in relation to the reference planes) by adjusting the position of the sensor in the three axes by virtue of the bearing points 313. This alignment makes it possible to correct the error of perpendicularity of the chip 201 in relation to the reference plane, as well as the offset in the mounting plane, that is to say the errors illustrated in FIGS. 3a and 3b. The machine holds the assembly (sensor+frame) in position during the polymerization of the glue. The glue is typically an epoxy resin with or without fillers. This step is performed in a single stage and dispenses with all the subsequent setting operations. After the gluing of the sensor, the sensitive face of the chip 201 (=face opposite the connection pins) is therefore collinear to the reference plane, in this case to the top surface 302 of the frame.

A positioning accuracy in the mounting plane is thus obtained that is typically of the order of 35 µm.

With the sensor being thus fixed to the frame, the camera objective 102 of an image-forming device will be able to be fixed to the frame 300 by virtue of the fixing reference points 317 and of the tappings 316 on the top face of the frame as can be seen in FIGS. 4 and 5. On completion of these two steps (gluing the sensor and fixing the camera objective), there will be an assurance that:

the photosensitive face of the chip is collinear to the reference plane of the frame and centred, and that the optical axis of the camera objective is at right angles to the reference plane of the frame and that the camera objective is centred.

The same steps are applied considering the mounting plane 301 as reference plane.

The mounting plane and that of the top face are advantageously collinear by construction.

The chip 201 can comprise 4 million pixels.

Figure 6:
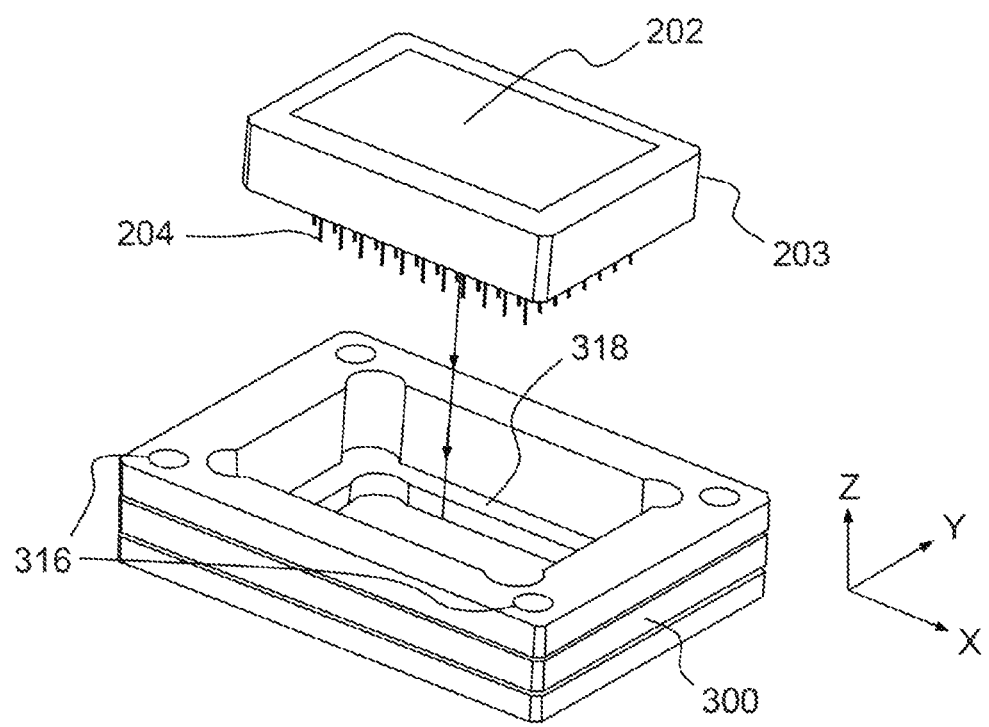

The frame is advantageously made of a thermally conductive material such as aluminium or copper. Before the gluing step, a thermal interface 318 shown in FIG. 6 is preferably placed on the gluing surface 301. This thermal interface allows the passage of the electrical connection pins 204 while ensuring a good thermal contact on the periphery of the sensor. This thermal interface makes it possible to ensure the exchanger and radiator functions in one and the same product. A thermally conductive glue is typically used, such as a UV glue which also makes it possible to fix the sensor 200 in the frame as indicated previously. By using an epoxy resin with or without fillers as glue, the thermal conductivity obtained is less than 4° C./W between the sensor 200 and the mechanical fixing plane 301.

Figure 7A:
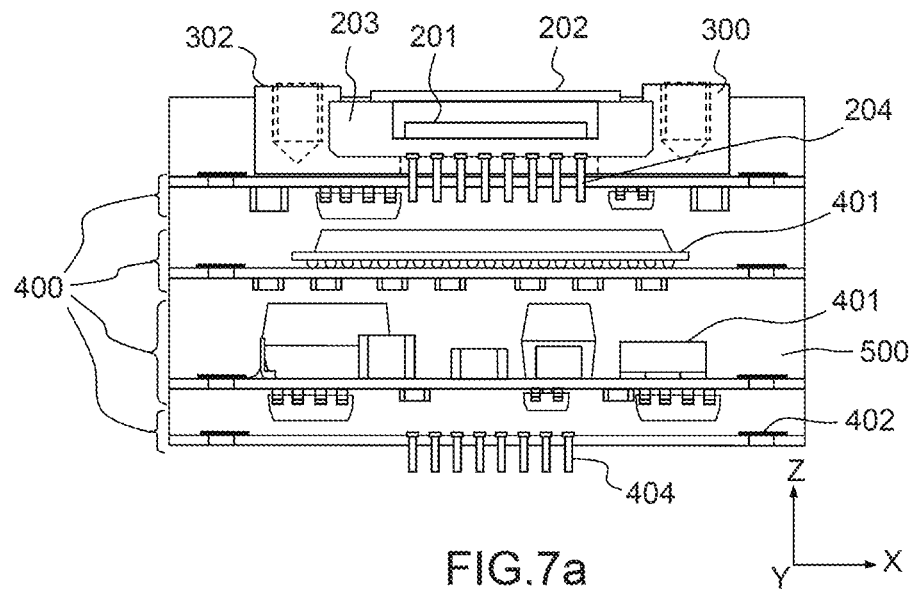
Figure 7B:
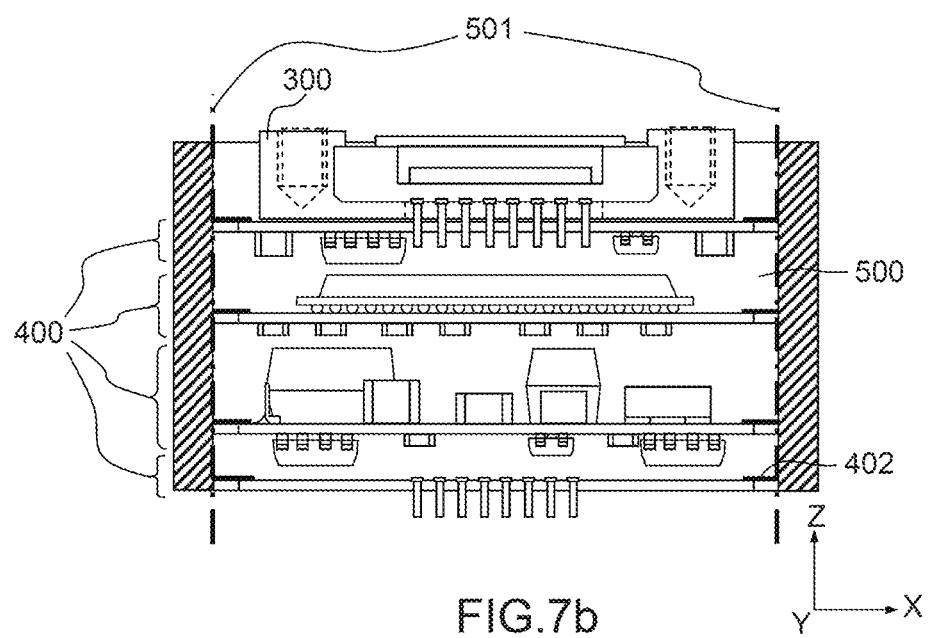

When the sensor has been fixed to the frame, the sensor+frame assembly is assembled with a stack of printed circuit boards 400 each comprising one or more active and/or passive electronic components 401 on one face or on both its faces, as shown in FIGS. 7a, 7b with a stack of four printed circuit boards 400. These components 401 are typically passive components for filtering parasitic interferences, for protecting the sensor, and active components such as processing units for the signals received by the chip, power supplies.

One of the problems with the sensors is jointly ensuring the mechanical fixing and the electrical link with these printed circuit boards. The connection to these printed circuit boards is made through a first printed circuit board PCB which comprises electrical connection contacts, and possibly electronic components. This PCB 400 is fixed to the frame 300 and the connection pins 204 of the sensor 200 are electrically linked to the connection contacts of the PCB by brazing. For example, the pins 204 pass through the PCB and are brazed on the bottom face side of the PCB. The frame 300 is thus sandwiched between the sensor and the PCB. This aspect reinforces the mechanical strength and the PCB does not need to be specifically in the same plane as the sensor 200 or the chip 201. This layout makes it possible to have a proximity between the chip and the electronic components of the stack, even by using a thermal interface as indicated previously. This solution makes it possible to significantly reduce the electronic noises which come into play in image capture.

Figure 8:
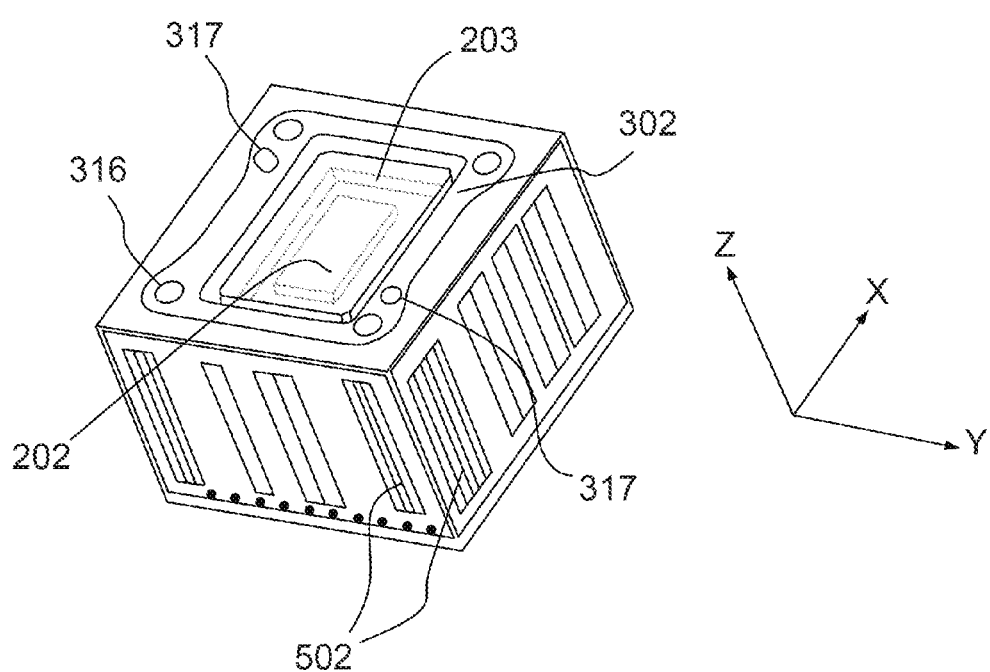

As can be seen in FIG. 7a, the sensor+cradle+stack assembly is then moulded in resin 500 up to the reference plane 302 of the cradle or slightly below as can be seen in the figure; the dimensions according to XY of the frame are less than those of the stack as can be seen in the figure. The moulded assembly is then cut according to the vertical cutting axes 501 (in the axis Z) with which electrically conductive tracks 402 of each printed circuit board are flush as shown in FIG. 7b. The vertical faces are then metallized and etched to produce the electrical interconnections 502 between the circuits of the stack as shown in FIG. 8. The last printed circuit board 400 is provided with external electrical connection means 404.

Such a module of which an example is shown in FIG. 8 with:
  interconnection tracks 502 on its side faces,
  the cradle 300 of which can be seen the top face with its tappings 316 and its reference points 317 for fixing an image-forming device 100,
  the sensor of which the protective glass 202 and the package 203 can be seen, will then be able to be associated with an image-forming device 100 with a view to an imaging application, in particular a space imaging application.

The invention claimed is:

1. A 3D imaging optoelectronic module intended to be fixed to an image-forming device which comprises:
   an optoelectronic sensor comprising a package in which is housed a photosensitive chip with planar active face, with, on the opposite face, electrical connection pins connected to
   a stack of at least one printed circuit board equipped with electronic components,
   the sensor and stack assembly being moulded in a resin and having vertical faces according to Z metallized and etched to form electrical interconnection tracks of the printed circuit boards,
   comprising a thermally conductive rigid cradle in the form of a frame delimiting an aperture at its centre through which said pins pass, the frame having a reference surface according to X, Y and:
     on a top surface:
       fixing reference points intended to centre and align the image-forming device in relation to the reference surface,
       fixing points intended to allow the fixing of the image-forming device, and
     an inner bearing surface having bearing points of the sensor adjusted for the active face of the chip to be centred and aligned in relation to the reference surface.

2. The 3D optoelectronic module according to claim 1, wherein the reference surface is the top surface.

3. The 3D optoelectronic module according to claim 2, wherein the inner bearing surface is collinear to the top surface.

4. The 3D optoelectronic module according to claim 3, wherein the optoelectronic sensor is that of a camera.

5. The 3D optoelectronic module according to claim 3, wherein the chip comprises 4 million pixels.

6. The 3D optoelectronic module according to claim 3, wherein the frame has a parallelepipedal outline dished on the outside.

7. A method for fabricating a 3D imaging optoelectronic module according to claim 1, comprising the following steps:
   positioning the optoelectronic sensor on the inner bearing surface so as to align and centre the active face of the chip in relation to the reference surface by means of the bearing points of the sensor,
   fixing the positioned sensor, by gluing,
   assembling the sensor+frame assembly with the stack of printed circuit boards,
   moulding the stack and the frame in resin without exceeding the top surface of the frame,
   cutting along cutting axes to obtain side faces,
   metallizing and etching the side faces to electrically interconnect the printed circuit boards.

* * * * *